(12) United States Patent
Yamashita et al.

(10) Patent No.: US 12,020,943 B2
(45) Date of Patent: Jun. 25, 2024

(54) SUBSTRATE PROCESSING METHOD AND SUBSTRATE PROCESSING APPARATUS

(71) Applicant: TOKYO ELECTRON LIMITED, Tokyo (JP)

(72) Inventors: Atsushi Yamashita, Kumamoto (JP); Koji Kagawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/690,709

(22) Filed: Mar. 9, 2022

(65) Prior Publication Data

US 2022/0301880 A1   Sep. 22, 2022

(30) Foreign Application Priority Data

Mar. 17, 2021   (JP) ................. 2021-043648

(51) Int. Cl.
| | |
|---|---|
| *H01L 21/311* | (2006.01) |
| *B08B 3/08* | (2006.01) |
| *B08B 13/00* | (2006.01) |
| *F26B 5/00* | (2006.01) |
| *H01L 21/02* | (2006.01) |
| *H01L 21/3213* | (2006.01) |

(52) U.S. Cl.
CPC .......... *H01L 21/31111* (2013.01); *B08B 3/08* (2013.01); *B08B 13/00* (2013.01); *F26B 5/005* (2013.01); *H01L 21/0206* (2013.01); *B08B 2203/007* (2013.01); *H01L 21/02189* (2013.01); *H01L 21/02282* (2013.01); *H01L 21/31144* (2013.01); *H01L 21/32139* (2013.01)

(58) Field of Classification Search
CPC .......... H01L 21/31111; H01L 21/0206; H01L 21/02189; H01L 21/02282; H01L 21/31144; H01L 21/32139; H01L 21/02063; H01L 21/0332; H01L 21/67028; H01L 21/67051; H01L 21/033; H01L 21/0331; H01L 21/67075; H01L 21/02057; H01L 21/67034; H01L 21/6708; B08B 3/08; B08B 13/00; B08B 2203/007; F26B 5/005
See application file for complete search history.

(56) References Cited

U.S. PATENT DOCUMENTS 5,474,877 A *  12/1995  Suzuki ............. G03F 7/3021
                                                        430/330
2004/0188385 A1*  9/2004  Yamada ........... H01L 21/31111
                                                        257/E21.251
(Continued)

FOREIGN PATENT DOCUMENTS

JP           2005-79316 A        3/2005

*Primary Examiner* — Erin F Bergner
(74) *Attorney, Agent, or Firm* — Nath, Goldberg & Meyer; Jerald L. Meyer; Tanya E. Harkins

(57) ABSTRACT

A substrate processing method includes: a preparing process of preparing a substrate in which a zirconium oxide film as a mask has been formed on a laminated film and dry-etched into a given shape; after the preparing process, a mask removing process of removing the zirconium oxide film by supplying a mask removing liquid containing sulfuric acid as a main component to the substrate; and after the mask removing process, a drying process of drying a surface of the substrate that is wet with a rinsing liquid.

14 Claims, 12 Drawing Sheets

(56) References Cited

U.S. PATENT DOCUMENTS

| | | | |
|---|---|---|---|
| 2010/0192992 A1* | 8/2010 | Toshima | H01L 21/67057 414/222.01 |
| 2013/0203262 A1* | 8/2013 | Butterbaugh | B81C 1/00539 438/748 |
| 2016/0093492 A1* | 3/2016 | Lee | H01L 21/0337 438/492 |
| 2016/0300710 A1* | 10/2016 | Oishi | H01L 21/67017 |
| 2019/0019675 A1* | 1/2019 | Lee | H01B 1/04 |

* cited by examiner

FIG. 10
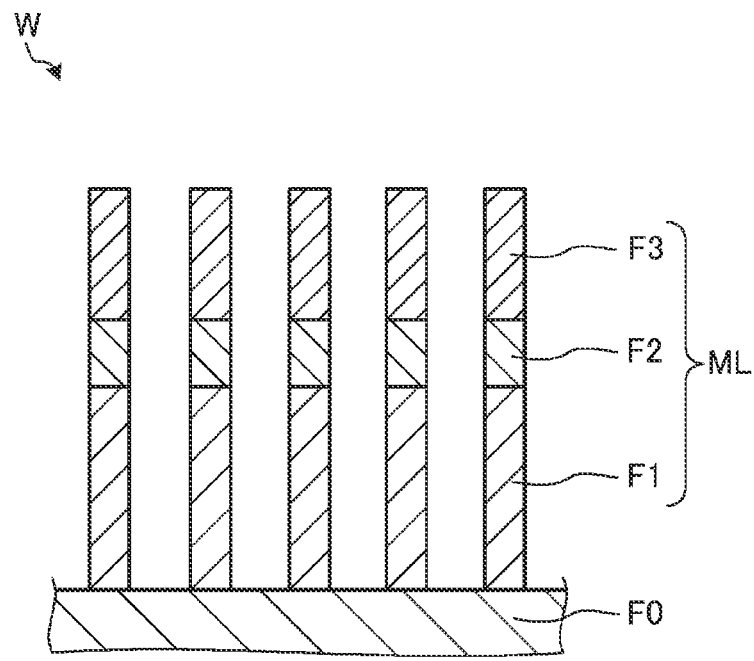
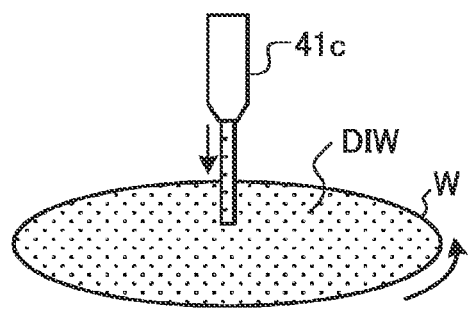
FIG. 11A
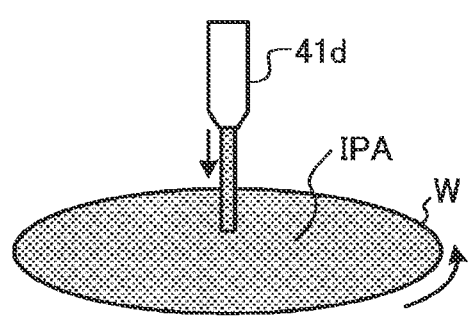
FIG. 11B

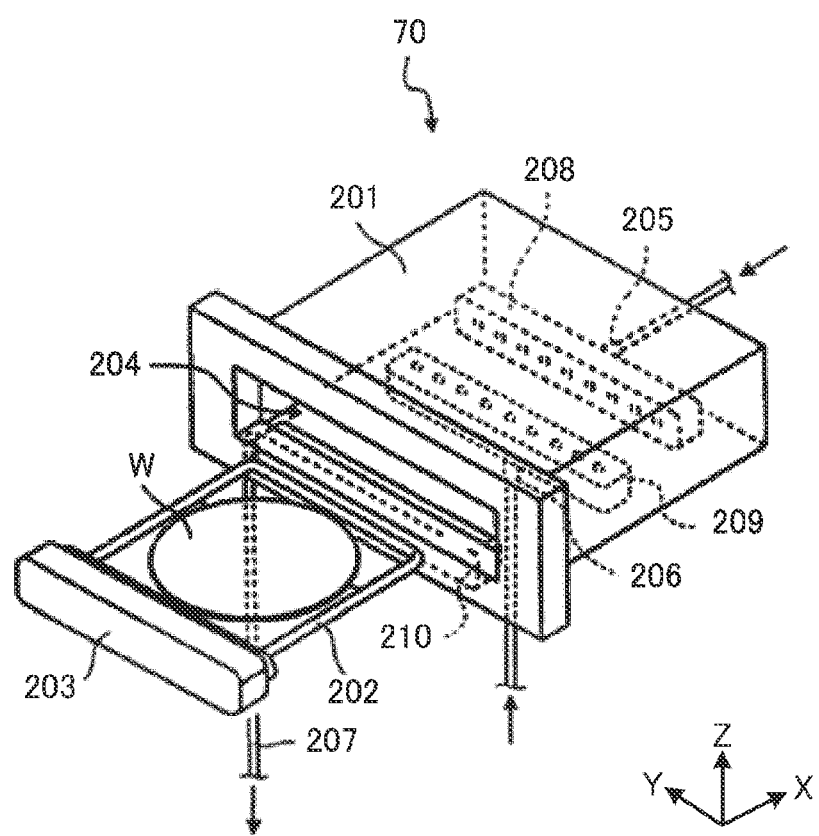

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2021-043648, filed on Mar. 17, 2021, the entire contents of which are incorporated herein by reference.

TECHNICAL FIELD

Embodiments disclosed herein relate to a substrate processing method and a substrate processing apparatus.

BACKGROUND

Conventionally, there is known a technique for etching a zirconium oxide ($ZrO_2$) film formed on a substrate such as a semiconductor wafer (hereinafter, also referred to as a "wafer") and used as a gate oxide film into a given pattern shape (see Patent Document 1).

PRIOR ART DOCUMENT

Patent Document

Patent Document 1: Japanese Laid-Open Patent Publication No. 2005-079316

SUMMARY

According to one embodiment of the present disclosure, there is provided a substrate processing method includes: a preparing process of preparing a substrate in which a zirconium oxide film as a mask has been formed on a laminated film and dry-etched into a given shape; after the preparing process, a mask removing process of removing the zirconium oxide film by supplying a mask removing liquid containing sulfuric acid as a main component to the substrate; and after the mask removing process, a drying process of drying a surface of the substrate that is wet with a rinsing liquid.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 is a schematic view illustrating an example of a state of the wafer surface after the residue removing process according to the embodiment.

FIGS. 11A and 11B are schematic views illustrating a rinsing process and a drying process according to an embodiment.

FIG. 14 is a schematic view illustrating an example of a specific configuration of a drying process unit according to Modification 2 of the embodiment.

DETAILED DESCRIPTION

Hereinafter, embodiments of a substrate processing method and a substrate processing apparatus disclosed herein will be described in detail with reference to the accompanying figures. The present disclosure is not limited by the embodiments described below. In addition, it should be noted that the figures are schematic, and the relationships between dimensions of respective elements, the ratios of the respective elements, and the like may differ from reality. Also, there may be a case where the relationship of dimensions and the ratios differ from each other between the figures.

Conventionally, there is known a technique for etching a zirconium oxide ($ZrO_2$) film formed on a substrate such as a semiconductor wafer (hereinafter, also referred to as a "wafer") and used as a gate oxide film into a given pattern shape.

Meanwhile, when the zirconium oxide film is used as a mask, it is necessary to finally remove all of the film without affecting other films as much as possible. However, little is known about a process for satisfactorily removing the zirconium oxide film used as a mask.

Therefore, there is a need to realize a technique that is capable of overcoming the above-mentioned problems and satisfactorily removes a zirconium oxide film used as a mask from a substrate.

<Outline of Substrate Processing System>

Figure 1:
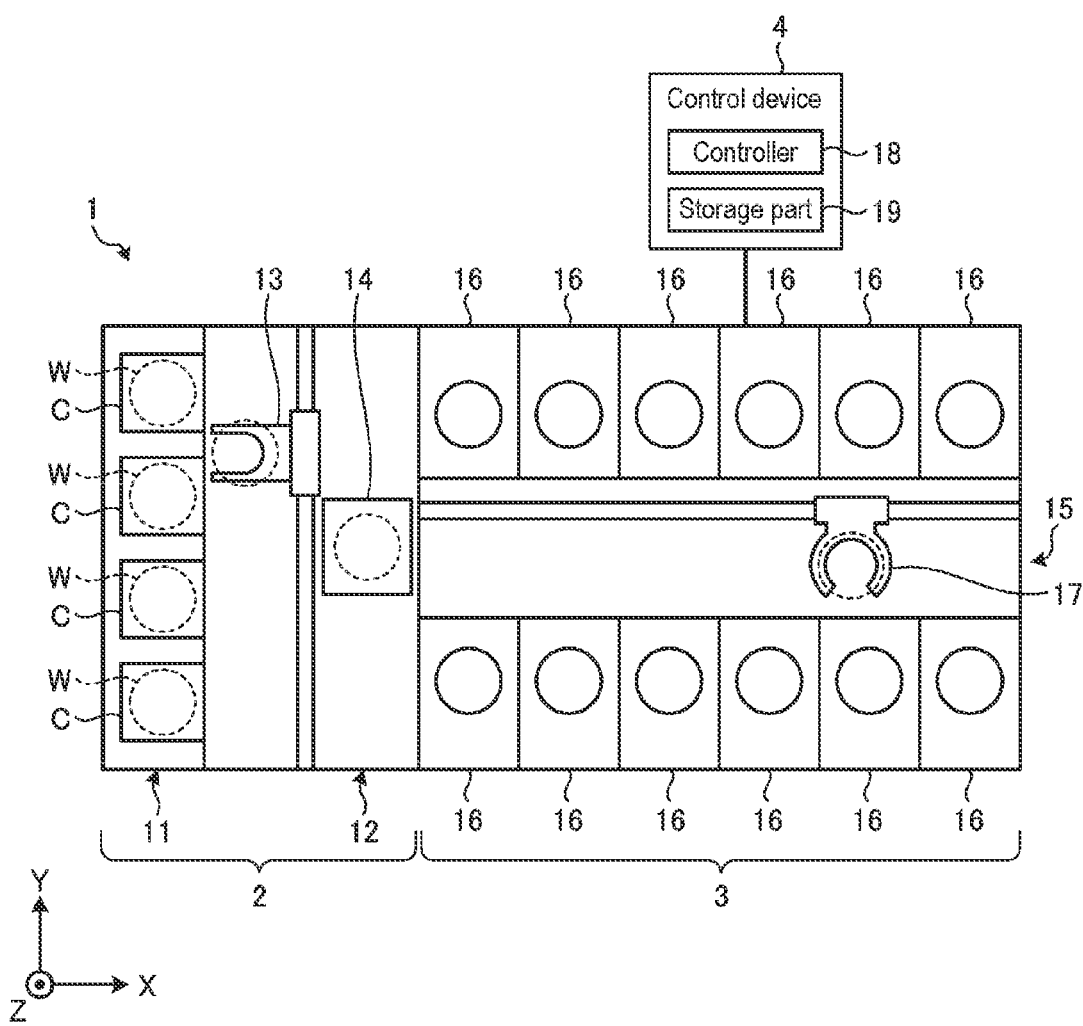
FIG. 1 is a schematic view illustrating an outline configuration of a substrate processing system according to an embodiment.

First, an outline configuration of a substrate processing system 1 according to an embodiment will be described with reference to FIG. 1. FIG. 1 is a view illustrating the outline configuration of the substrate processing system 1 according to an embodiment. In addition, the substrate processing system 1 is an example of a substrate processing apparatus. In the following description, in order to clarify positional relationships, the X axis, the Y axis, and the Z axis, which are orthogonal to each other, are defined, and the positive direction of the Z axis is defined as a vertically upward direction.

As illustrated in FIG. 1, the substrate processing system 1 includes a loading/unloading station 2 and a processing station 3. The loading/unloading station 2 and the processing station 3 are provided adjacent to each other.

The loading/unloading station 2 includes a carrier placement part 11 and a transfer part 12. A plurality of carriers C, each configured to accommodate a plurality of substrates (in the embodiment, semiconductor wafers W (hereinafter, referred to as "wafers W")) in a horizontal state, are placed on the carrier placement part 11.

The transfer part 12 is provided adjacent to the carrier placement part 11 and includes therein a substrate transfer device 13 and a delivery part 14. The substrate transfer device 13 includes a water holding mechanism configured to hold the wafer W. In addition, the substrate transfer device 13 is movable in the horizontal direction and the vertical direction and rotatable about a vertical axis, and thus transfers the wafer W between the carrier C and the delivery part 14 using the wafer holding mechanism.

The processing station 3 is provided adjacent to the transfer part 12. The processing station 3 includes a transfer part 15 and a plurality of process units 16. The plurality of process units 16 are arranged side by side on opposite sides of the transfer part 15.

The transfer part 15 includes therein a substrate transfer device 17. The substrate transfer device 17 includes a wafer holding mechanism configured to hold the wafer W. In addition, the substrate transfer device 17 is movable in the horizontal direction and the vertical direction and rotatable about a vertical axis thereof, and thus transfers the wafer W between the delivery part 14 and the process unit 16 using the wafer holding mechanism.

Each process unit 16 performs predetermined substrate processing on the wafer W transferred thereto by the substrate transfer device 17.

In addition, the substrate processing system 1 includes a control device 4. The control device 4 is, for example, a computer, and includes a controller 18 and a storage 19. The storage 19 stores programs for controlling various processes to be executed in the substrate processing system 1. The controller 18 controls the operation of the substrate processing system 1 by reading and executing the programs stored in the storage 19.

In addition, the programs may be stored in a non-transitory computer-readable storage medium, and may be installed on the storage 19 of the control device 4 from the storage medium. The computer-readable storage medium includes, for example, a hard disk (HD), a flexible disk (FD), a compact disk (CD), a magneto-optical disk (MO), a memory card and the like.

In the substrate processing system configured as described above, first, the substrate transfer device 13 of the loading/unloading station 2 takes out the wafer W from the carrier C placed on the carrier placement part 11 and places the taken-out wafer W on the delivery part 14. The wafer W placed on the delivery part 14 is taken out from the delivery part 14 by the substrate transfer device 17 in the processing station 3 and loaded into the process unit 16.

After being processed by the process unit 16, the wafer W loaded into the process unit 16 is unloaded from the process unit 16 and placed on the delivery part 14 by the substrate transfer device 17. Then, the processed wafer W placed on the delivery part 14 is returned to the carrier C in the carrier placement part 11 by the substrate transfer device 13.

[Configuration of Process Unit]

Figure 2:
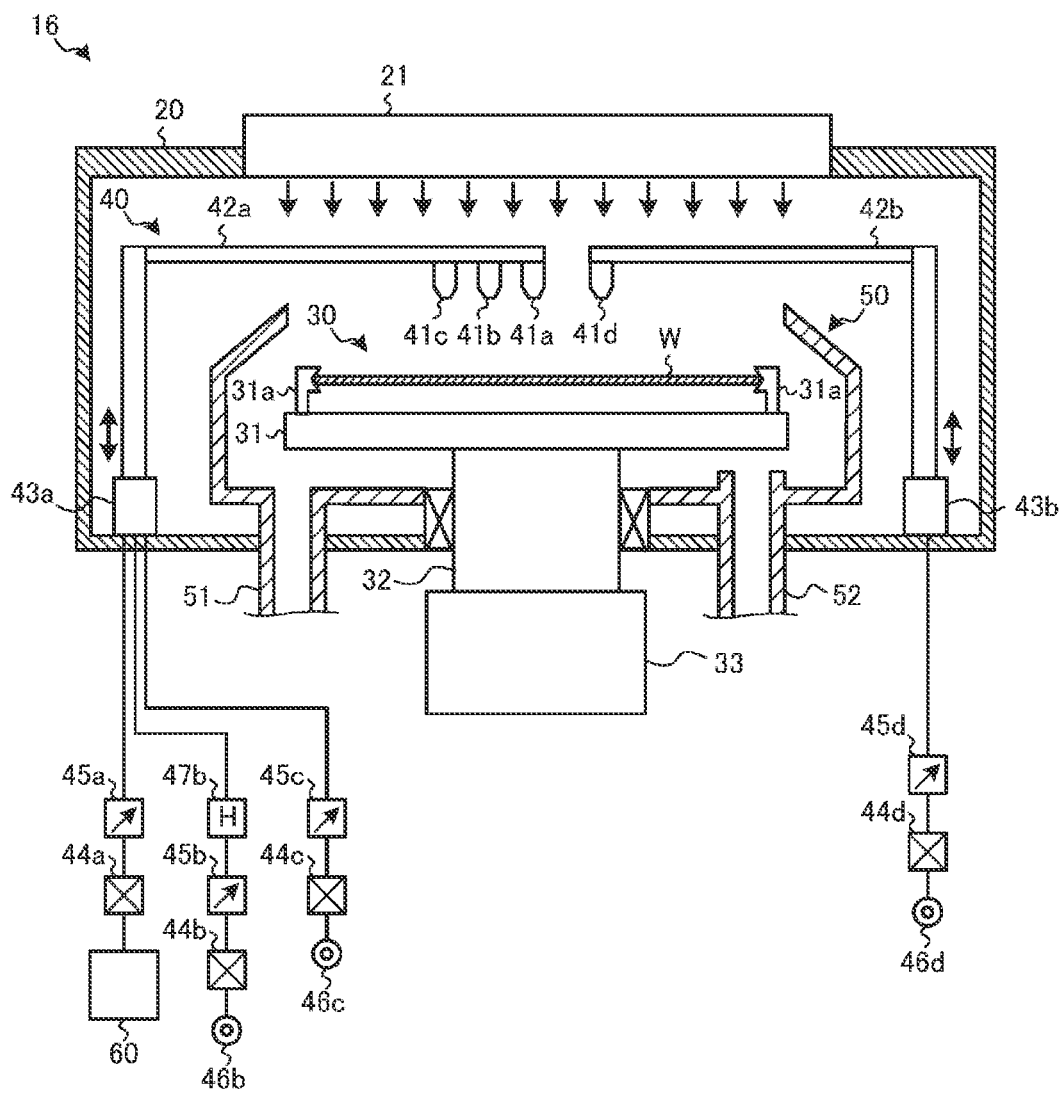
FIG. 2 is a schematic view illustrating an example of a specific configuration of a process unit according to an embodiment.

Next, a configuration of the process unit 16 will be described with reference to FIG. 2. FIG. 2 is a schematic view illustrating an example of a specific configuration of the process unit 16. As illustrated in FIG. 2, the process unit 16 includes a chamber 20, a substrate processing part 30, a liquid supplier 40, and a recovery cup 50.

The chamber 20 accommodates the substrate processing part 30, the liquid supplier 40, and the recovery cup 50, The ceiling of the chamber 20 is provided with a fan filter unit (FFU) 21, The FFU 21 forms a down-flow within the chamber 20.

The substrate processing part 30 includes a holder 31, a support column 32, and a driver 33, and performs liquid processing on the placed wafer W. The holder 31 holds the wafer W horizontally. The support column 32 is a member extending in the vertical direction. A base end portion of the support column 32 is rotatably supported by the driver 33 and a tip end portion thereof horizontally supports the holder 31. The driver 33 rotates the support column 32 around a vertical axis thereof.

The substrate processing part 30 rotates the holder 31 supported by the support column 32 by rotating the support column 32 using the driver 33, whereby the wafer W held by the holder 31 is rotated.

Holding members 31a for holding the wafer \V from the side thereof are provided on the top surface of the holder 31 provided in the substrate processing part 30. The wafer W is horizontally held by the holding members 31a in the state of being slightly spaced apart from the top surface of the holder 31. The wafer W is held by the holder 31 in the state in which the surface on which the substrate processing is performed is oriented upward.

The liquid supplier 40 supplies a processing fluid to the wafer W. The liquid supplier 40 includes a plurality of (three in this embodiment) nozzles 41a to 41c, an arm 42a that horizontally supports the nozzles 41a to 41c, and a rotating and lifting mechanism 43a that rotates and move up and down the arm 42a. The liquid supplier 40 includes a nozzle 41d, an arm 42b that horizontally supports the nozzle 41d, and a rotating and lifting mechanism 43b that rotates and moves up and down the arm 42b.

The nozzle 41a is connected to a mixed liquid supplier 60 via a valve 44a and a flow rate regulator 45a. Details of the mixed liquid supplier 60 will be described later.

The nozzle 41b is connected to a DIW source 46b via a valve 44b, a flow rate regulator 45b, and a heater 47. The DIW source 46b is, for example, a tank that stores deionized water (DIW). The DIW is an example of pure water. The heater 47 raises the temperature of the DIW supplied to the nozzle 41b based on a command from the controller 18.

The nozzle 41c is connected to a DI-IF source 46c via a valve 44c and a flow rate regulator 45c. The DHF source 46c is, for example, a tank that stores dilute hydrofluoric acid (DHF). The DHF is an example of an aqueous solution containing a fluorinated compound.

The nozzle 41d is connected to an IPA source 46d via a valve 44d and a flow rate regulator 45d. The IPA source 46d is, for example, a tank that stores isopropyl alcohol (IPA). The IPA is an example of a water-soluble alcohol and also an example of an organic solvent.

A mask removing liquid L1 (see FIG. 5) supplied from the mixed liquid supplier 60 is ejected from the nozzle 41a. Details of the mask removing liquid L1 will be described later. DIW supplied from the DIW source 46b or hot DIW (HDIW) which is DIW heated to a given temperature by the heater 47 is ejected from the nozzle 41b.

DHF supplied from the DHF source 46c is ejected from the nozzle 41c. IPA supplied from the IPA source 46d is ejected from the nozzle 41d.

The recovery cup 50 is disposed to surround the holder 31 and collects the processing liquid scattered from the wafer W with the rotation of the holder 31. A drainage port 51 is formed in the bottom portion of the recovery cup 50, and the processing liquid collected by the recovery cup 50 is discharged from the drainage port 51 to the outside of the process unit 16. In addition, in the bottom portion of the recovery cup 50, an exhaust port 52 is formed to discharge the gas supplied from the FFU 21 to the outside of the process unit 16.

<Configuration of Mixed Liquid Supplier>

Figure 3:
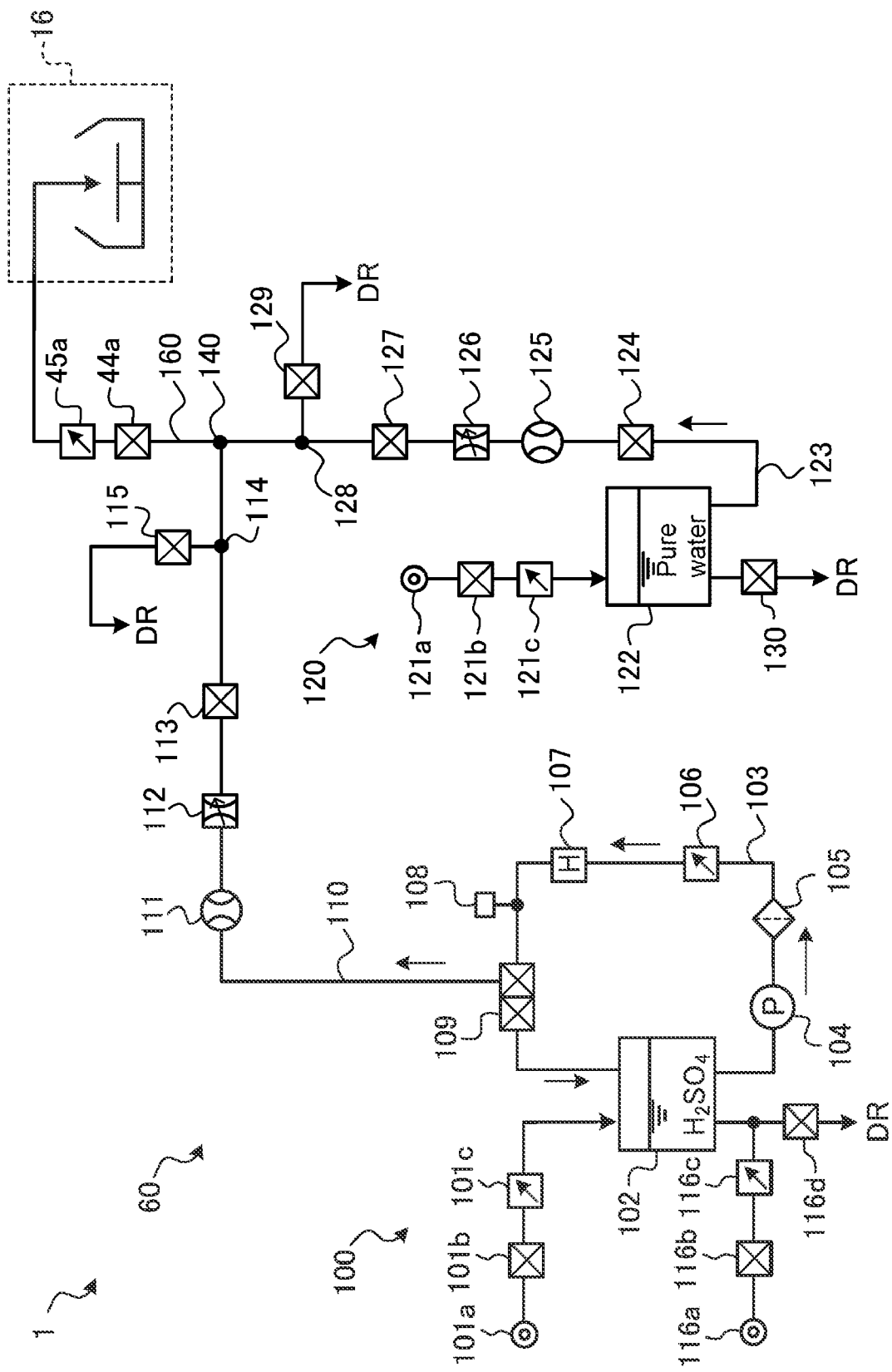
FIG. 3 is a view illustrating an example of a configuration of a mixed liquid supplier according to an embodiment.

Next, a configuration of the mixed liquid supplier 60 included in the substrate processing system 1 will be described with reference to FIG. 3. FIG. 3 is a view illustrating an example of the configuration of the mixed liquid supplier 60 according to the embodiment. Each part of the mixed liquid supplier 60 illustrated below is controlled by the controller 18.

As illustrated in FIG. 3, the mixed liquid supplier 60 according to the embodiment includes a sulfuric acid supplier 100, a pure water supplier 120, and a mixing part 140.

The sulfuric acid supplier 100 supplies sulfuric acid to the mixing part 140. The sulfuric acid is, for example, concentrated sulfuric acid. The sulfuric acid supplier 100 includes a sulfuric acid source 101a, a valve 101b, a flow rate regulator 101c, a tank 102, a circulation line 103, and a sulfuric acid supply line 110.

The sulfuric acid source 101a is connected to the tank 102 via the valve 101b and the flow rate regulator 101c. As a result, the sulfuric acid source 101a is capable of supplying the sulfuric acid to the tank 102 via the valve 101b and the flow rate regulator 101c to store the sulfuric acid in the tank 102.

The circulation line 103 is a circulation line that exits from the tank 102 and returns to the tank 102. The circulation line 103 is provided with a pump 104, a filter 105, a flow rate regulator 106, a heater 107, a thermocouple 108, and a switching part 109 in this order from the upstream side with reference to the tank 102.

The pump 104 forms a circulating flow of the sulfuric acid that exits from the tank 102, passes through the circulation line 103, and returns to the tank 102. The filter 105 removes contaminants such as particles contained in the sulfuric acid circulating in the circulation line 103. The flow rate regulator 106 regulates a flow rate of the circulating flow of the sulfuric acid passing through the circulation line 103.

The heater 107 heats the sulfuric acid circulating in the circulation line 103. The thermocouple 108 measures a temperature of the sulfuric acid circulating in the circulation line 103. Therefore, the controller 18 is capable of controlling the temperature of the sulfuric acid circulating in the circulation line 103 using the heater 107 and the thermocouple 108.

The switching part 109 is connected to the mixing part 140 of the mixed liquid supplier 60 via the sulfuric acid supply line 110 so that the orientation of the sulfuric acid circulating in the circulation line 103 can be switched to the tank 102 or the mixing part 140 by the switching part 109.

The sulfuric acid supply line 110 is provided with a flow meter 111, a power-operated needle valve 112, a valve 113, and a branch portion 114 in this order from the upstream side with reference to the switching part 109.

The flow meter 111 measures the flow rate of the sulfuric acid flowing through the sulfuric acid supply line 110. The needle valve 112 regulates the flow rate of the sulfuric acid flowing through the sulfuric acid supply line 110. The branch portion 114 is connected to a drain part DR via the valve 115.

The controller 18 is capable of feedback-controlling the needle valve 112 using a value measured by the flow meter 111 so that the sulfuric acid can be supplied to the mixing part 140 at a high-precision flow rate.

In addition, the tank 102 is provided with a pure water source 116a, a valve 116b, a flow rate regulator 16c, and a valve 116d. The tank 102 is connected to the drain part DR via the valve 116d, and the pure water source 116a is connected between the tank 102 and the valve 116d via the valve 116b and the flow rate regulator 116c.

As a result, the controller 18 is capable of controlling the valve 116b, the flow rate regulator 116c, and the valve 116d, for example, when exchanging the sulfuric acid inside the tank 102 so that the concentrated sulfuric acid inside the tank 102 can be diluted in a given concentration and discharged to the drain part DR.

The pure water supplier 120 supplies DIW to the mixing part 140. The pure water supplier 120 includes a pure water source 121a, a valve 121b, a flow rate regulator 121c, a tank 122, and a pure water supply line 123.

The pure water source 121a is connected to the tank 122 via the valve 121b and the flow rate regulator 121c. As a result the pure water source 121a is capable of supplying pure water to the tank 122 via the valve 121b and the flow rate regulator 121c so that the pure water can be stored in the tank 122.

The pure water supply line 123 is provided with a valve 124, a flow meter 125, a power-operated needle valve 126, a valve 127, and a branch portion 128 in this order from the upstream side with reference to the tank 122.

The flow meter 125 measures a flow rate of the pure water flowing through the pure water supply line 123. The needle valve 126 adjusts the flow rate of the pure water flowing through the pure water supply line 123. The branch portion 128 is connected to the drain part DR via the valve 129.

The controller 18 is capable of feedback-controlling the needle valve 126 using a value measured by the flow meter 125 so that the pure water can be supplied to the mixing part 140 at a high-precision flow rate.

The tank 122 is connected to the drain part DR via the valve 130. As a result, the controller 18 is capable of controlling the valve 130, for example, when the pure water inside the tank 122 is replaced, so that the pure water inside the tank 122 can be discharged to the drain part DR.

Figure 5:
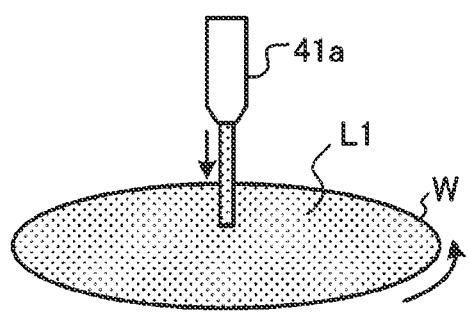
FIG. 5 is a schematic view illustrating a mask removing process according to an embodiment.

The mixing part 140 mixes the sulfuric acid supplied from the sulfuric acid supplier 100 and the pure water supplied from the pure water supplier 120 to generate the mask removing liquid L1 (see FIG. 5). In the embodiment, the mixing part 140 is provided at a position where the sulfuric acid supply line 110 and the pure water supply line 123 are joined.

The mixing part 140 is connected to the process unit 16 via the mixed liquid supply line 160. In addition, the mixed liquid supply line 160 is provided with the above-described valve 44a and flow rate regulator 45a. As a result, the mixed liquid supplier 60 is capable of supplying the mask removing liquid L1 having a mixing ratio set by a user, to the process unit 16.

As described above, the sulfuric acid supplier 100 is provided with the heater 107, and the sulfuric acid and the pure water react with each other in the mixing part 140.

Thus, the temperature of the mask removing liquid L1 rises. As a result, the mixed liquid supplier 60 of the embodiment is capable of raising the temperature of the mask removing liquid L1 to a desired temperature and supplying the mask removing liquid L1 to the process unit 16.

For example, the mixed liquid supplier 60 raises the temperature of the concentrated sulfuric acid to about 120 degrees C. using the heater 107 of the sulfuric acid supplier 100. In addition, the mixed liquid supplier 60 heats the mask removing liquid L1 to about 150 degrees C. by the reaction heat generated when the sulfuric acid and DIW are mixed in the mixing part 140.

Although not illustrated in FIG. 3, an additional valve or the like may be provided in the circulation line 103 or the like.

<Details of Substrate Processing>

Figure 4:
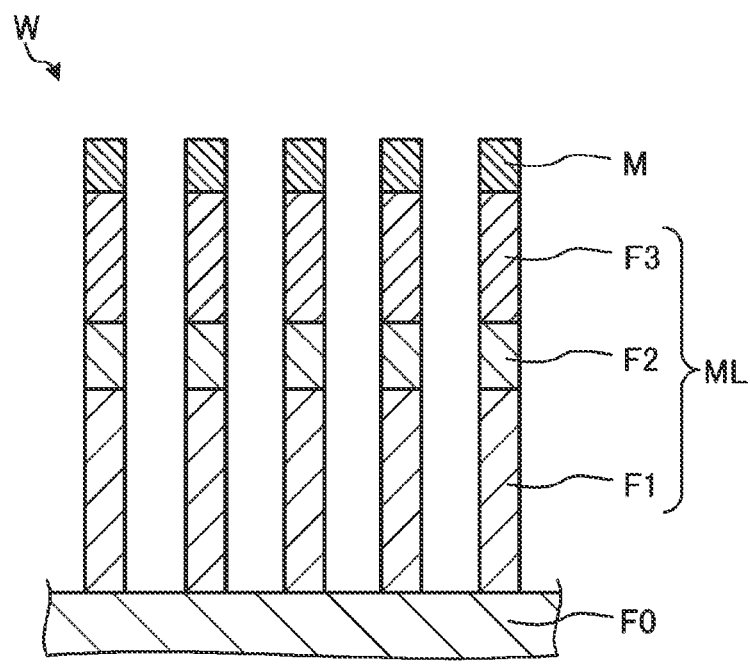
FIG. 4 is a schematic view illustrating an example of a state of a wafer surface after a preparing process according to an embodiment.

Next, details of the substrate processing for the wafer W in the process unit 16 will be described with reference to FIGS. 4 to 11B. In the substrate processing according to the embodiment, first, the wafer W having a surface structure as illustrated in FIG. 4 is prepared. FIG. 4 is a schematic view illustrating an example of a state of the surface of the wafer W after a preparing process according to the embodiment.

As illustrated in FIG. 4, a multilayer film ML and a mask M are firmed on the surface of the wafer W. The multilayer film ML is formed on the surface of a base layer F0. The base layer F0 is made of, for example, silicon oxide ($SiO_2$).

The multilayer film ML has, for example, a first layer F1, a second layer F2, and a third layer F3, which are disposed in this order from the surface of the base layer F0. The first layer F1 is made of, for example, polysilicon. The second layer F2 is made of, for example, tungsten. The third layer F3 is made of, for example, silicon nitride (SiN).

The mask M is formed on the surface of the multilayer film MI. (specifically, the surface of the third layer F3). The mask M is made of zirconium oxide. That is, the mask M is a zirconium oxide film.

The mask M according to the embodiment is formed by, for example, applying a raw material liquid containing zirconium oxide to the surface of the wafer W and then annealing the raw material liquid at a given temperature (e.g., about 450 degrees C.).

As illustrated in FIG. 4, the multilayer film ML and the mask M are dry-etched into a given shape with a high aspect ratio so that the surface of the base layer F0 is partially exposed. In the present disclosure, the configurations of the base layer F0 and the multilayer film ML are not limited to the example of FIG. 4.

Subsequently, the wafer W having the surface structure described so far is carried into the chamber 20 of the process unit 16 by the substrate transfer device 17. Then, the wafer W is held by the holding member 31a of the substrate processing part 30 in a state in which the surface to be subjected to the substrate processing is oriented upward. Thereafter, the controller 18 (see FIG. 1) controls the driver 33 to rotate the holding member 31a together with the wafer W at a given rotation speed.

In the process unit 16, as illustrated in FIG. 5, the mask removing process is performed by the mask removing liquid L1. FIG. 5 is a schematic view illustrating the mask removing process according to the embodiment. In such a mask removing process, the controller 18 moves the nozzle 41a of the liquid supplier 40 (see FIG. 2) to the upper side of the center of the wafer W.

Thereafter, the controller 18 supplies the mask removing liquid L1 containing concentrated sulfuric acid to the surface of the wafer W by opening the valve 44a for a given time.

As a result, the controller 18 is capable of etching only the mask M with high selectivity among the plurality of films formed on the surface of the wafer W.

According to the embodiment, it is possible to satisfactorily remove the zirconium oxide film used as the mask M from the wafer W.

In the mask removing liquid L1 according to the embodiment, for example, the concentrated sulfuric acid (having a concentration of, for example, 96%) and the pure water may be mixed at a ratio of 4:1 to 1:0. This makes it possible to etch only the mask M with higher selectivity from among the plurality of films formed on the surface of the wafer W.

Therefore, according to the embodiment, it is possible to more satisfactorily remove a zirconium oxide film used as a mask M from the wafer W.

In addition, in the mask removing process according to the embodiment, the mask removing liquid L1 may be heated with reaction heat generated when the sulfuric acid and the DIW are mixed. As a result, since it is possible to perform the mask removing process at a higher temperature, it is possible to etch only the mask M with higher selectivity from among the plurality of films formed on the surface of the wafer W.

Therefore, according to the embodiment, it is possible to more satisfactorily remove the zirconium oxide film used as the mask M from the wafer W.

In the embodiment, the mask M may be made of a zirconium oxide film formed through a wet method, rather than a vapor phase synthesis method. This makes it possible to more satisfactorily remove the mask M with the mask removing liquid L1 in which the sulfuric acid and the pure water are mixed, compared with a zirconium film formed through a vapor phase synthesis method.

Therefore, according to the embodiment, it is possible to more satisfactorily remove the zirconium oxide film used as the mask M from the wafer W.

In the embodiment, since it is possible to remove the mask M through a wet process using the mask removing liquid L1, rather than through a dry process, the film quality of the multilayer film ML can be maintained better than that in the case of removing the mask M through the dry process.

For example, when the mask M is removed through the dry process, the dry process affects not only the mask M but also the multilayer film ML. Thus, there is a risk of adverse effects such as rounding of the corners of the third layer F3 adjacent to the mask M. However, in the embodiment, since it is possible to remove the mask M through the wet etching with the mask removing liquid L1, it is possible to suppress the occurrence of such an adverse effect.

Figure 6:
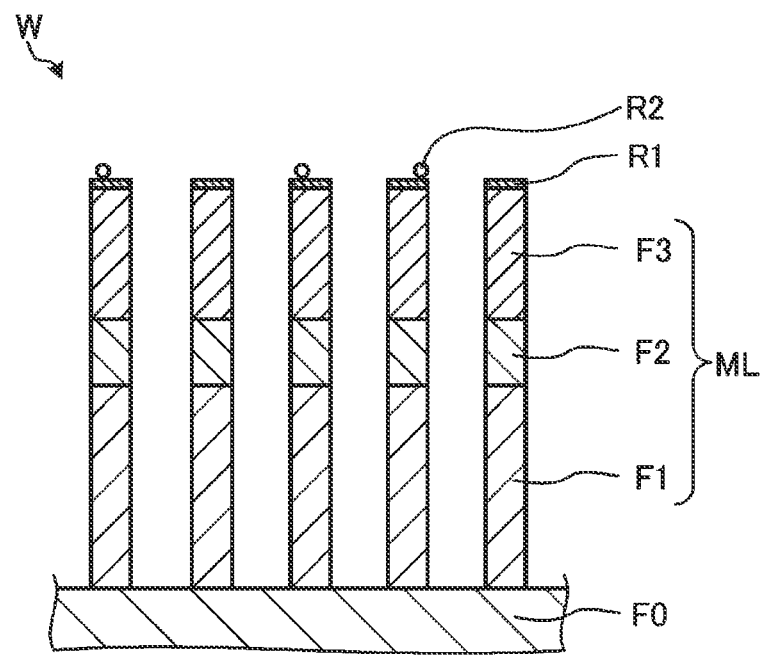
FIG. 6 is a schematic view illustrating an example of a state of the wafer surface after the mask removing process according to the embodiment.

FIG. 6 is a schematic view illustrating an example of the state of the surface of the wafer W after the mask removing process according to the embodiment. As illustrated in FIG. 6, in the embodiment, after the mask removing process, the mask M may be satisfactorily removed from the surface of the wafer W, while a residue R1 and a residue R2 may remain.

The residue R1 is a residue caused by the zirconium oxide film as the mask M (see FIG. 4). Specifically, the residue R1 contains silicide formed at the interface between the third layer F3 and the mask M when a raw material liquid containing zirconium oxide is applied to the surface of the wafer W and then annealed to form the mask M.

In addition, the residue R2 is a residue caused by the mask removing liquid L1. Specifically, the residue R2 is a particle containing a sulfur (S) component included in the mask removing liquid L1.

Figure 7:
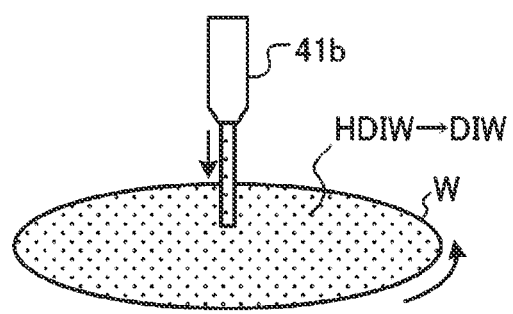
FIG. 7 is a schematic view illustrating a pre-residue removing process according to an embodiment.
Figure 8:
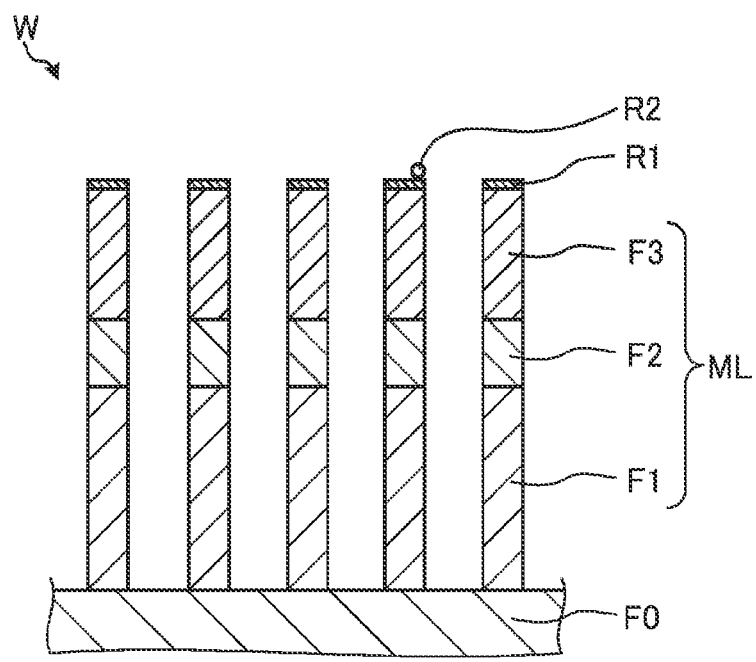
FIG. 8 is a schematic view illustrating an example of a state of the wafer surface after the pre-residue removing process according to the embodiment.

Therefore, in the embodiment, in order to remove the residues R1 and R2 from the wafer W, a pre-residue removing process and a residue removing process are performed. The pre-residue removing process is an example of another residue removing process. FIG. 7 is a schematic view illustrating the pre-residue removing process according to the embodiment, and FIG. 8 is a schematic view illustrating an example of the state of the surface of the wafer W after the pre-residue removing process according to the embodiment.

As illustrated in FIG. 7, in the pre-residue removing process, the controller 18 (see FIG. 1) moves the nozzle 41b of the liquid supplier 40 (see FIG. 2) to the upper side of the center of the wafer W. Thereafter, the controller 18 opens the valve 44b for a given time, so that the HDIW heated to a given temperature is supplied to the surface of the wafer W.

In addition, the controller 18 stops the operation of the heater 47 (see FIG. 2), so that unheated (e.g., room temperature) DIW is supplied to the surface of the wafer W. As a result, the controller 18 is capable of removing a large amount of the residue R2 from the surface of the wafer W as illustrated in FIG. 8.

Since the multilayer ML is not etched by the HDIW and the DIW, the pre-residue removing process according to the embodiment does not affect the film quality of the multilayer film ML.

Figure 9:
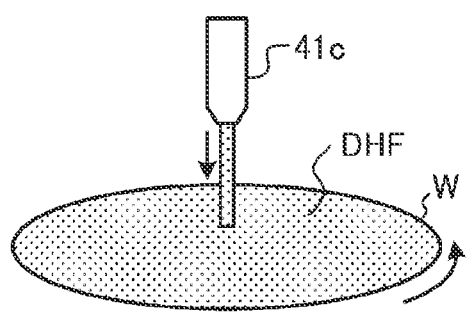
FIG. 9 is a schematic view illustrating a residue removing process according to an embodiment.

Following this pre-residue removing process, in the embodiment, the residue removing process is performed. FIG. 9 is a schematic view illustrating the residue removing process according to the embodiment, and FIG. 10 is a schematic view illustrating an example of the state of the surface of the wafer W after the residue removing process according to the embodiment.

As illustrated in FIG. 9, in the residue removing process, the controller 18 (see FIG. 1) moves the nozzle 41c of the liquid supplier 40 (see FIG. 2) to the upper side of the center of the wafer W. Thereafter, the controller 18 opens the valve 44c for a given time, so that the DHF is supplied to the surface of the wafer W. As a result, as illustrated in FIG. 10, the controller 18 is capable of satisfactorily removing the residue R1 and the residue R2 from the surface of the wafer W.

The DHF used for the residue removing process has a certain degree of etching performance not only for the residue R1 containing silicide but also for the multilayer film ML. However, in the embodiment, since the zirconium oxide film other than the silicide film is removed by the mask removing process, the time for the residue removing process itself can be shortened. Therefore, according to the embodiment, the film quality of the multilayer film ML can be maintained well even after the residues R1 and R2 are removed.

In the embodiment, by performing the pre-residue removing process before the residue removing process, a large amount of the residue R2 can be removed before the residue removing process. As a result, the time for the residue removing process itself can be further shortened. Therefore, according to the embodiment, the film quality of the multilayer film ML can be maintained better even after the residues R1 and R2 are removed.

In the above-described example, an example in which the residue removing process is performed with DHF has been illustrated, but the processing liquid used for the residue removing process is not limited to the DHF, and various aqueous solutions containing a fluorine compound may be used. In the above example, the residue removing process may be performed using, for example, an aqueous solution containing a given ratio of ammonia (i.e., ammonia water). It is also possible to satisfactorily remove the residue R1 and the residue R2 with these processing liquids.

Following this residue removing process, in the embodiment, a rinsing process and a drying process are performed. FIGS. 11A and 11B are schematic views showing the rinsing process and the drying process according to the embodiment.

As illustrated in FIG. 11A, in the rinsing process, the controller 18 (see FIG. 1) moves the nozzle 41c of the liquid supplier 40 (see FIG. 2) to the upper side of the center of the wafer W. Thereafter, the controller 18 opens the valve 44c for a given time, so that DIW is supplied to the surface of the wafer W.

As a result, the DI-IF supplied in the immediately-previous residue removing process is removed from the surface of the wafer W, and as illustrated in FIG. 11A, a DIW layer (a so-called puddle) is formed on the surface of the wafer W.

In the drying process performed following the rinsing process, first, as illustrated in FIG. 11B, the controller 18 moves the nozzle 41d of the liquid supplier 40 to the upper side of the center of the wafer W. Thereafter, the controller 18 opens the valve 44d for a given time, so that IPA is supplied to the surface of the wafer W. This causes the DIW puddle on the surface of the wafer W to be replaced with the IPA puddle, as illustrated in FIG. 11B.

Then, in the embodiment, the controller 18 increases the rotation speed of the wafer W on which the IPA puddle is formed, to shake off the IPA puddle from the surface of the wafer W. As a result, the drying process of the wafer W is completed.

As described above, in the embodiment, after the residue removing process, in the state in which the surface of the rinsed wafer W remains wet, the DIW puddle on the surface of the wafer W may be replaced with the IPA puddle and then a shake-off process may be performed.

This makes it possible to prevent the pattern of the multilayer film ML formed on the wafer W with a high aspect ratio from collapsing due to the surface tension of the DIW during drying. Therefore, according to the embodiment, the yield of the wafer W can be improved.

In the above-described example, an example of replacing the DIW puddle with the IPA puddle is illustrated, but the processing liquid used for the replacement process is not limited to the IPA, and various water-soluble alcohols may be used. This also makes it possible to prevent the pattern of the multilayer film ML formed on the wafer W with a high aspect ratio from collapsing due to the surface tension of the DIW during drying.

In the embodiment, the mask M removing process may be performed by a single-wafer processing apparatus such as the process unit 16. This makes it possible to remove the mask M more evenly on the entire surface of the wafer W compared with a batch process in which a plurality of wafers W are processed together.

<Modification 1>

Figure 12:
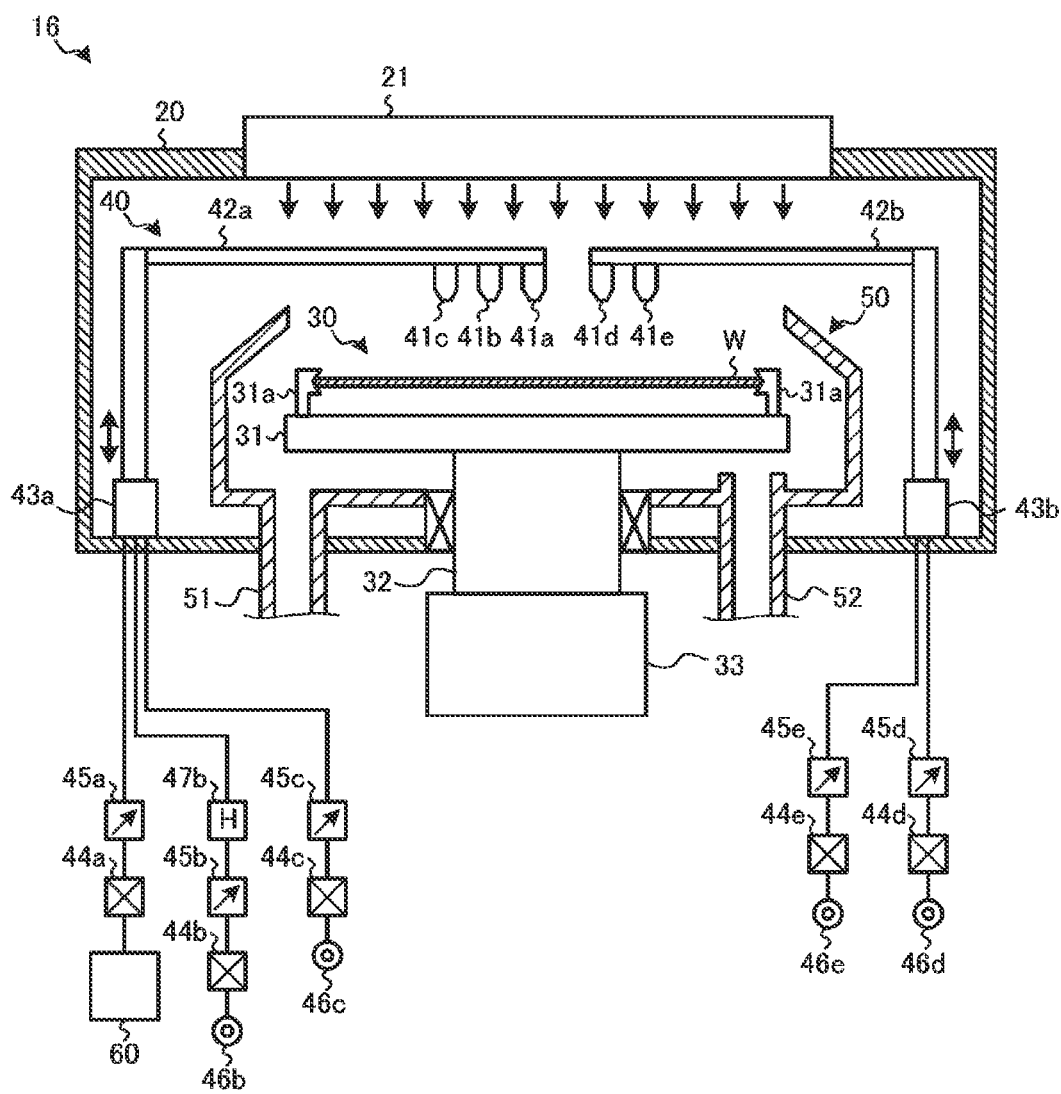
FIG. 12 is a schematic view illustrating an example of a specific configuration of a process unit according to Modification 1 of the embodiment.

Next, various modifications of the substrate processing according to the embodiment will be described with reference to FIGS. 12 to 15. FIG. 12 is a schematic view illustrating an example of a specific configuration of a process unit 16 according to Modification 1 of the embodiment.

As illustrated in FIG. 12, the process unit 16 according to Modification 1 differs from that of the above-described embodiment (see FIG. 2) in that a nozzle 41e is added to the arm 42*b*. Specifically, the nozzle 41*e* is connected to a water-repellent agent source 46*e* via a valve 44*e* and a flow rate regulator 45*e*.

The water-repellent agent source 46*e* is, for example, a tank that stores a water-repellent agent L2 (see FIGS. 13A to 13D). The water-repellent agent L2 supplied from the water-repellent agent source 46*e* is ejected from the nozzle 41*e*.

Here, the water-repellent agent L2 is obtained by diluting, for example, a water-repellent agent for making the surface of the wafer W water-repellent, with thinner to a predetermined concentration. As the water-repellent agent for a raw material, for example, a silylating agent (or a silane coupling agent) may be used.

Specifically, for example, trimethylsilyldimethylamine (TMSDMA), dimethylsilyldimethylamine (DMSDMA), trimethylsilyldiethylamine (TMSDEA), hexamethyldisilazane (HMDS), and the like may be used as the water-repellent agent for a raw material.

As the thinner, an ether solvent, an organic solvent belonging to a ketone, or the like may be used. Specifically, for example, propylene glycol monomethyl ether acetate (PGMEA), cyclohexanone, hydrofluoro ether (FIFE), and the like may be used as the thinner.

Since the process unit 16 according to Modification 1 is the same as the above-described embodiment except for the above points, the description of other parts will be omitted.

FIGS. 13A to 13D are schematic views illustrating a rinsing process and a drying process according to Modification 1 of the embodiment. In the substrate processing according to Modification 1, since the preparing process, the mask removing process, the pre-residue removing process, and the residue removing process are the same as those in the above-described embodiment, a detailed description thereof will be omitted.

Figure 13A:
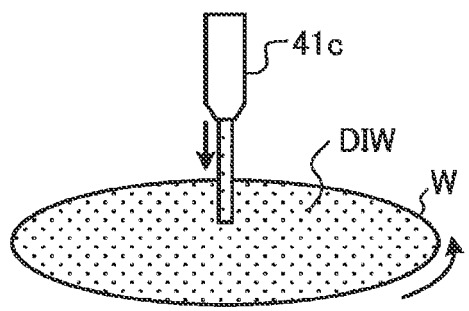
FIGS. 13A to 13D are schematic views illustrating a rinsing process and a drying process according to Modification 1 of the embodiment.

As illustrated in FIG. 13A, in the rinsing process, the controller 18 (see FIG. 1) moves the nozzle 41*c* of the liquid supplier 40 (see FIG. 2) to the upper side of the center of the wafer W. Thereafter, the controller 18 opens the valve 44*c* for a given time, so that DIW is supplied to the surface of the wafer W.

As a result, the DHF supplied in the immediately-previous residue removing process is removed from the surface of the wafer W, and as illustrated in FIG. 13A, a DIW puddle is formed on the surface of the wafer W.

Figure 13B:
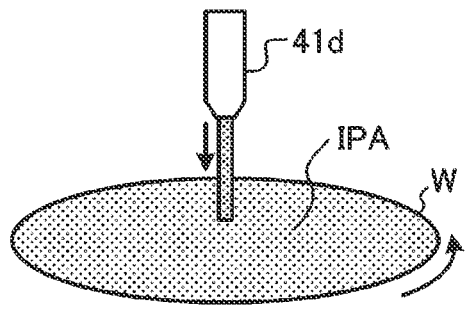

In the drying process performed following the rinsing process, first, as illustrated in FIG. 13B, the controller 18 moves the nozzle 41*d* of the liquid supplier 40 to the upper side of the center of the wafer W. Thereafter, the controller 18 opens the valve 44*d* for a given time, so that IPA is supplied to the surface of the wafer W. This causes the DIW puddle on the surface of the wafer W to be replaced with the IPA puddle, as illustrated in FIG. 13B.

Figure 13C:
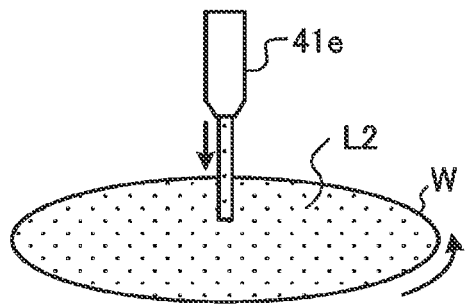

Subsequently, as illustrated in FIG. 13C, the controller 18 moves the nozzle 41*e* of the liquid supplier 40 to the upper side of the center of the wafer W. Thereafter, the controller 18 opens the valve 44*e* for a given time, so that a water-repellent agent L2 is supplied to the surface of the wafer W. As a result, as illustrated in FIG. 13C, the IPA puddle on the surface of the wafer W is replaced with the water-repellent agent L2 puddle, so that the surface of the wafer W is made water-repellent.

Figure 13D:
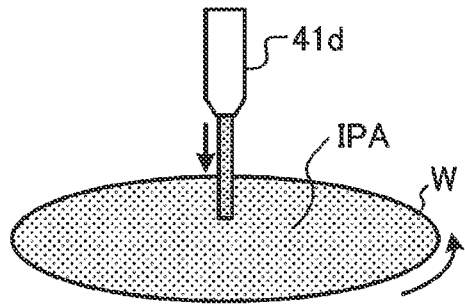

Subsequently, as illustrated in FIG. 13D, the controller 18 moves the nozzle 41*d* of the liquid supplier 40 to the upper side of the center of the wafer W. Thereafter, the controller 18 opens the valve 44*d* for a given time, so that IPA is supplied to the surface of the wafer W. This causes the water-repellent agent L2 puddle on the surface of the wafer W to be replaced with the IPA puddle, as illustrated in FIG. 13D.

Then, in Modification 1, the controller 18 increases the rotation speed of the wafer W on which the IPA puddle is formed, to shake off the IPA puddle from the surface of the wafer W. As a result, the drying process of the wafer W is completed.

As described above, in Modification 1, after the residue removing process, in the state in which the surface of the rinsed wafer W remains wet, the surface of the wafer W is made water-repellent with the water-repellent agent L2, the water-repellent agent L2 is replaced with an IPA puddle, and then a shake-off process is performed.

This makes it possible to of prevent the pattern of the multilayer film ML formed on the wafer W with a high aspect ratio from collapsing due to the surface tension of the DIW during drying. Therefore, according to Modification 1, the yield of the wafer W can be further improved.

<Modification 2>

Modification 2 is different from the above-described embodiment in that the substrate processing system 1 is provided with a drying process unit 70 that performs a drying process on the wafer W in addition to the process unit 16. FIG. 14 is a schematic view illustrating an example of a specific configuration of the drying process unit 70 according to Modification 2 of the embodiment.

As illustrated in FIG. 14, the drying process unit 70 includes a main body 201, a holding plate 202, and a lid member 203. In the main body 201 having a housing shape, an opening 204 for loading and unloading the wafer W is formed. The holding plate 202 holds the wafer \V to be processed in a horizontal direction. The lid member 203 supports the holding plate 202 and closes the opening 204 when the wafer W is loaded into the main body 201.

The main body 201 is a container in which a processing space capable of accommodating one wafer W is formed, and is provided with supply ports 205 and 206 and discharge ports 207 in a wall thereof. The supply ports 205 and 206 and the discharge port 207 are connected respectively to a supply flow path and a discharge flow path that allow a supercritical fluid to flow through the drying process unit 70.

The supply port 205 is connected to the side surface of the housing-shaped main body 201 on the side opposite to the opening 204. The supply port 206 is connected to the bottom surface of the main body 201. The discharge port 207 is connected to the lower side of the opening 204. Although FIG. 14 illustrates two supply ports 205 and 206 and one discharge port 207, the numbers of supply ports 205 and 206 and discharge ports 207 are not particularly limited.

Inside the main body 201, fluid supply headers 208 and 209 and a fluid discharge header 210 are provided. A plurality of supply ports are formed side by side in the fluid supply, headers 208 and 209 in the longitudinal direction of the fluid supply headers 208 and 209, and a plurality of discharge ports are formed side by side in the fluid discharge header 210 in the longitudinal direction of the fluid discharge header 210.

The fluid supply header 208 is connected to the supply port 205, and is provided inside the housing-shaped main body 201 adjacent to the side surface on the side opposite to the opening 204. The plurality of supply ports formed side by side on the fluid supply header 208 face the opening 204.

The fluid supply header 209 is connected to the supply port 206, and is provided in the central portion of the bottom surface inside the housing-shaped main body 201. In addition, the plurality of supply ports formed side by side in the fluid supply header 209 are oriented upward.

The fluid discharge header 210 is connected to the discharge port 207, and is provided inside the housing-shaped main body 201 below the opening 204 and adjacent to the side surface on the opening 204 side. In addition, the plurality of discharge ports formed side by side in the fluid discharge header 210 are oriented upward.

The fluid supply headers 208 and 209 supply the supercritical fluid into the main body 201. The fluid discharge header 210 guides and discharges the supercritical fluid in the main body 201 to the outside of the main body 201. The supercritical fluid discharged to the outside of the main body 201 via the fluid discharge header 210 includes an IPA liquid dissolved in the supercritical fluid in the supercritical state from the surface of the wafer W.

In the drying process according to Modification 2, first, as illustrated in FIG. 11B, the controller 18 (see FIG. 1) moves the nozzle 41d of the liquid supplier 40 (see FIG. 2) to the upper side of the center of the wafer W. Thereafter, the controller 18 opens the valve 44d for a given time, so that IPA is supplied to the surface of the wafer W. This causes the DIW puddle on the surface of the wafer W to be replaced with the IPA puddle, as illustrated in FIG. 11B.

Subsequently, the controller 18 transfers the wafer W on which the IPA puddle is formed from the process unit 16 to the drying process unit 70 using the substrate transfer device 17 as it is. Then, the controller 18 controls the drying process unit 70 to perform a supercritical drying process on the wafer W on which the IPA puddle is formed.

Specifically, the drying process unit 70 brings the wafer W on which the IPA puddle is formed into contact with a processing fluid (e.g., $CO_2$) in the supercritical state. Then, since the IPA liquid between the patterns formed on the wafer W gradually dissolves in the supercritical fluid by coming into contact with the supercritical fluid which is in a high-pressure state (e.g., 16 MPa), the IPA liquid gradually dissolves in the supercritical fluid so that the IPA liquid between the patterns is gradually replaced with the supercritical fluid, Finally, only the supercritical fluid fills the space between the patterns.

After the IPA liquid is removed from the space between the patterns, the pressure inside the main body 201 is reduced from the high-pressure state to the atmospheric pressure, so that $CO_2$, which is the processing fluid, changes from the supercritical state to a gaseous state. Thus, the space between the patterns is occupied only by gas. In this way, the IPA liquid between the patterns is removed, and the drying process of the wafer W is completed.

As described above, in Modification 2, after the residue removing process, a DIW puddle on the surface of the rinsed wafer W is replaced with an IPA puddle, and the surface of the wafer W is further dried using a processing fluid in a supercritical state.

This makes it possible to effectively prevent the pattern of the multilayer film ML formed on the wafer W with a high aspect ratio from collapsing due to the surface tension of the DIW during drying, Therefore, according to Modification 2, the yield of the wafer W can be further improved.

<Modification 3>

Figure 15:
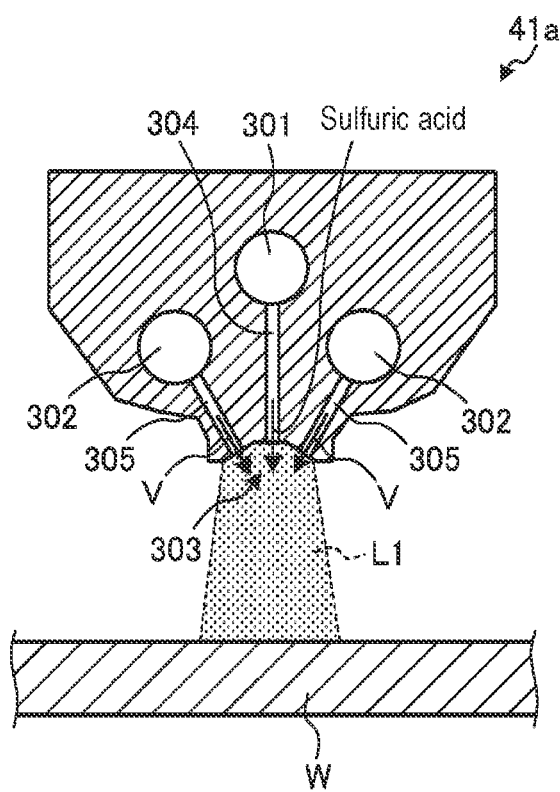
FIG. 15 is a cross-sectional view illustrating an example of a configuration of a nozzle according to Modification 3 of the embodiment.

In Modification 3, a configuration of the nozzle 41a for ejecting the mask removing liquid L1 to the wafer W is different from that of the above-described embodiment. FIG. 15 is a cross-sectional view illustrating an example of the configuration of the nozzle 41a according to Modification 3 of the embodiment.

The nozzle 41a according to Modification 3 is, for example, a bar nozzle. As illustrated in FIG. 15, one sulfuric acid supply path 301 and two steam supply paths 302 are inserted side by side in the longitudinal direction of the nozzle 41a inside the nozzle 41a.

To the sulfuric acid supply path 301, sulfuric acid heated to a given temperature (e.g., 120 degrees C.) is supplied from a sulfuric acid source (not illustrated) via a valve (not illustrated) and a flow rate regulator (not illustrated). Steam is supplied to the steam supply path 302 from a steam generator (not illustrated) via a valve (not illustrated) and a flow rate regulator (not illustrated).

In addition, an ejection path 304 is connected between the ejection port 303 formed in the bottom surface of the nozzle 41a and the sulfuric acid supply path 301, and an ejection path 305 is connected between the ejection port 303 and the steam supply path 302.

That is, sulfuric acid is supplied to the ejection port 303 of the nozzle 41a through the ejection path 304, and steam V is supplied through the ejection path 305.

Then, in the nozzle 41a according to Modification 3, the sulfuric acid and the steam V are mixed at the ejection port 303 to generate a mask removing liquid L1. That is, in the present disclosure, since the sulfuric acid and the steam V are mixed for the time at which the sulfuric acid and the steam V reach the wafer W after being ejected from the nozzle 41a, the mask removing liquid L1 is generated. In addition, a plurality of ejection ports 303 are arranged side by side along the longitudinal direction of the nozzle 41a.

As a result, the nozzle 41a according to Modification 3 is capable of ejecting the mask removing liquid L1 generated due to mixing of the sulfuric acid and the steam V to the wafer W from the plurality of ejection ports 303. In addition, the mask removing liquid L1 is heated by reaction heat generated when the steam V and the sulfuric acid are mixed (e.g., 160 degrees C. to 180 degrees C.).

This makes it possible to etch only the mask M with higher selectivity from among the plurality of films formed on the surface of the wafer W. Therefore, according to Modification 3, it is possible to more satisfactorily remove a zirconium oxide film used as the mask M from the wafer W.

The substrate processing apparatus (the substrate processing system 1) according to the embodiment includes the holder 31, the liquid supplier 40, and the controller IS. The holder 31 holds and rotates the substrate (wafer W). The liquid supplier 40 supplies the processing liquid to the substrate (wafer W) held by the holder 31. The controller 18 controls each part. The controller 18 causes the mask removing liquid L1 containing sulfuric acid as a main component to be supplied to the substrate (wafer W) in which the zirconium oxide film as the mask M has been formed on a laminated film ML and thy-etched into a given shape, so that the zirconium oxide film is removed. In addition, after the zirconium oxide film is removed, the controller 18 causes the surface of the substrate (wafer W) that is wet with a rinsing liquid to be dried. This makes it possible to satisfactorily remove the zirconium oxide film used as the mask M from the wafer W.

<Procedure of Substrate Processing>

Figure 16:
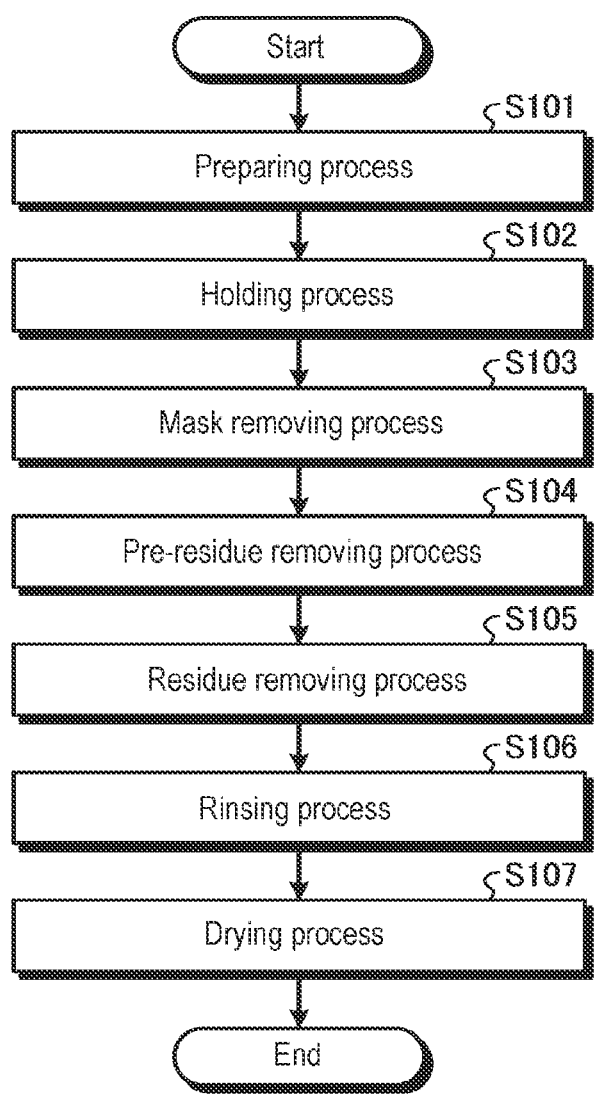
FIG. 16 is a flowchart illustrating a substrate processing procedure executed by a substrate processing system according to an embodiment.

Next, a procedure of the substrate processing according to the embodiment will be described with reference to FIG. 16. FIG. 16 is a flowchart showing the substrate processing procedure executed by the substrate processing system 1 according to the embodiment.

In the substrate processing according to the embodiment, first, the preparing process is performed (step S101). In the preparing process, as illustrated in FIG. 4, the wafer W in which a zirconium oxide film as a mask M has been formed on a laminated film ML and dry-etched into a given shape is prepared.

Subsequently, the controller 18 controls the process unit 16 and the like to perform a holding process of holding the wafer W by the holder 31 (step S102). Then, the controller 18 controls the liquid supplier 40 and the like to perform a mask removing process of supplying the mask removing liquid L1 containing sulfuric acid as a main component to the wafer W and removing the mask M made of the zirconium oxide film (step S103).

The mask removing process is performed with, for example, the mask removing liquid L1 in which concentrated sulfuric acid (e.g., a concentration of 96%) and pure water are mixed at a ratio of 4:1 to 1:0. In the mask removing process, for example, the processing time is 30 (seconds) to 600 (seconds), the ejecting amount of the mask removing liquid L1 is 600 (mL/m) to 2,000 (mL/m), and the rotation speed of the wafer W is 200 (rpm) to 2,000 (rpm).

Subsequently, the controller 18 controls the liquid supplier 40 and the like to supply HDIW to the wafer W to perform a pre-residue removing process of removing the residue R2 (step S104).

Subsequently, the controller 18 controls the liquid supplier 40 and the like to supply DHF or ammonia water to the wafer W to carry out a residue removing process of removing at least one of the residue R1 and the residue R2 (step S105).

When the residue removing is performed using DHF, the residue removing process is performed using DHF in which hydrofluoric acid and pure water are mixed at, for example, a ratio of 1:400 to 1:200, in the residue removing process, for example, the processing time is 10 (seconds) to 300 (seconds), the ejecting amount of the DHF is 1,000 (mL/m) to 2,000 (mL/m), and the rotation speed of the wafer W is 200 (rpm) to 2,000 (rpm).

Subsequently, the controller 18 controls the liquid supplier 40 and the like to perform the rinsing process on the wafer W with DIW (step S106). Then, the controller 18 controls the process unit 16 to perform a drying process on the wafer W (step S107), and a series of substrate processing processes are completed.

As the drying process, on the surface of the wafer W that is wet with, for example, DIW, the DIW may be replaced with IPA and then a shake-off process may be performed. In the drying process, for example, the surface of the wafer W may be made water-repellent with a water-repellent agent L2, then the water-repellent agent L2 may be replaced with an IPA puddle, and then the shake-off process may be performed.

Furthermore, in the drying process, for example, the DIW puddle on the surface of the rinsed wafer W may be replaced with an IPA puddle, and the surface of the wafer W may be further dried using a processing fluid in a supercritical state.

The substrate processing method according to the embodiment includes the preparing process (step S101), the mask removing process (step S103), and the drying process (step S107). In the preparing process (step S101), the substrate (wafer W) in which the zirconium oxide film as the mask M has been formed on the laminated film ML and dry-etched into a given shape is prepared. In the mask removing process (step S103), after the preparing process (step S101), the mask removing liquid L1 containing sulfuric acid as a main component is supplied to the substrate (wafer W to remove the zirconium oxide film. In the drying process (step S107), after the mask removing process (step S103), the surface of the substrate (wafer W) that is wet with a rinsing liquid (DIW) is dried. This makes it possible to satisfactorily remove the zirconium oxide film used as the mask M from the wafer W.

The substrate processing method according to the embodiment further includes the residue removing process (step S105). In the residue removing process, after the mask removing process (step S103), the aqueous solution (DHF) containing a fluoride compound is supplied to the substrate (wafer W) to remove the residue R1 or R2 caused by at least one of the zirconium oxide film and the mask removing liquid L1. This makes it possible to satisfactorily remove the residue R1 and the residue R2 from the surface of the wafer W.

The substrate processing method according to the embodiment further includes the residue removing process (step S105). In the residue removing process, after the mask removing process (step S103), the aqueous solution containing ammonia is supplied to the substrate (wafer W) to remove the residue R1 or R2 caused by at least one of the zirconium oxide film and the mask removing liquid L1. This makes it possible to satisfactorily remove the residue R1 and the residue R2 from the surface of the wafer W.

In addition, the substrate processing method according to the embodiment further includes another residue removing process (the pre-residue removing process) (step S104). In another residue removing process, the heated pure water (HDIW) is supplied to the substrate (wafer W) between the mask removing process (step S103) and the residue removing process (step S105) to remove the residue R2 caused by the mask removing liquid L1. This makes it possible to maintain the film quality of the multilayer film ML even better even after the residues R1 and R2 are removed.

In the substrate processing method according to the embodiment, in the drying process (step S107), on the surface of the substrate (water W) that is wet with a rinsing liquid (DIW), the DIW is replaced with the water-soluble alcohol (IPA) and then dried. This makes it possible to prevent the pattern of the multilayer film ML formed on the wafer W with a high aspect ratio from collapsing due to the surface tension of the DIW during drying.

In the substrate processing method according to the embodiment, in the drying process (step S107), the surface of the substrate (wafer \V) is dried using a processing fluid in a supercritical state. This makes it possible to effectively prevent the pattern of the multilayer film ML formed on the water W with a high aspect ratio from collapsing due to the surface tension of the DIW during drying.

In the substrate processing method according to the embodiment, the drying process (step S107) includes a first replacing process, a water-repellent process, a second replacing process, and a shake-off process. In the first replacing process, on the surface of the substrate (wafer W) that is wet with a rinsing liquid (DIW), the DIW is replaced with the organic solvent (IPA). In the water-repellent process, after the first replacing process, the water-repellent agent L2 is supplied to the surface of the substrate (wafer W). In the second replacing process, on the surface of the substrate (wafer W), the water-repellent agent is replaced with an organic solvent (IPA) after the water repellent step. In the shake-off process, after the second replacing process, the organic solvent (IPA) located on the surface of the substrate (wafer W) is shaken off. This makes it possible to effectively prevent the pattern of the multilayer film ML formed on the wafer W with a high aspect ratio from collapsing due to the surface tension of the DIW during drying.

In the substrate processing method according to the embodiment, in the mask removing process (step S103), the mask removing liquid L1 is heated by reaction heat generated when the sulfuric acid and the pure water (DIW) are mixed. This makes it possible to more satisfactorily remove the zirconium oxide film used as the mask M from the wafer W.

In the substrate processing method according to the embodiment, in the mask removing process (step S103), the mask removing liquid L1 is heated by reaction heat generated when the sulfuric acid and the steam are mixed. This makes it possible to more satisfactorily remove the zirconium oxide film used as the mask M from the water W.

According to the present disclosure, it is possible to satisfactorily remove a zirconium oxide film used as a mask from a substrate.

Although the embodiments of the present disclosure have been described above, the present disclosure is not necessarily limited to the above-described embodiments, and various changes can be made without departing from the spirit of the present disclosure.

The embodiments disclosed herein should be considered to be exemplary in all respects and not restrictive. Indeed, the above-described embodiments can be implemented in various forms. The embodiments described above may be omitted, replaced, or modified in various forms without departing from the scope and spirit of the appended claims.

What is claimed is:

1. A substrate processing method comprising: a preparing process of preparing a substrate in which a zirconium oxide film as a mask has been formed on a laminated film and dry-etched into a given shape and a silicide has been formed at an interface between the laminated film and the zirconium oxide film; after the preparing process, a mask removing process of removing the zirconium oxide film from a surface of the substrate by supplying, to the substrate, a mask removing liquid containing a mixture of sulfuric acid and pure water, wherein the sulfuric acid is a main component of the mask removing liquid; after the mask is removed from the surface of the substrate, a residue removing process of removing a residue including at least one of the silicide or a sulfur component from the surface of the substrate by supplying an aqueous solution containing a fluoride compound to the substrate; and after the residue removing process, a drying process of drying the surface of the substrate that is wet with a rinsing liquid.

2. The substrate processing method of claim 1, further comprising:
    between the mask removing process and the residue removing process, another residue removing process of removing a residue including the sulfur component by supplying heated pure water to the substrate.

3. The substrate processing method of claim 1, wherein, in the drying process, on the surface of the substrate that is wet with the rinsing liquid, the rinsing liquid is replaced with a water-soluble alcohol, and then the surface of the substrate is dried.

4. The substrate processing method of claim 1, wherein, in the drying process, the surface of the substrate is dried using a processing fluid in a supercritical state.

5. The substrate processing method of claim 1 wherein the drying process includes:
    a first replacing process of replacing the rinsing liquid on the surface of the substrate that is wet with the rinsing liquid with an organic solvent;
    a water-repellent process of supplying a water-repellent agent to the surface of the substrate after the first replacing process;
    a second replacing process of replacing the water-repellent agent on the surface of the substrate with an organic solvent after the water-repellent process; and
    a shake-off process of shaking off the organic solvent located on the surface of the substrate after the second replacing process.

6. The substrate processing method of claim 1, wherein, in the mask removing process, the mask removing liquid is heated by reaction heat generated when the sulfuric acid and the pure water are mixed.

7. The substrate processing method of claim 1, wherein, in the mask removing process, the mask removing liquid is heated by reaction heat generated when the sulfuric acid and steam are mixed.

8. A substrate processing method comprising: a preparing process of preparing a substrate in which a zirconium oxide film as a mask has been formed on a laminated film and dry-etched into a given shape and a silicide has been formed at an interface between the laminated film and the zirconium oxide film; after the preparing process, a mask removing process of removing the zirconium oxide film from a surface of the substrate by supplying, to the substrate, a mask removing liquid containing a mixture of sulfuric acid and pure water, wherein the sulfuric acid is a main component of the mask removing liquid; after the mask is removed from the surface of the substrate, a residue removing process of removing a residue including at least one of the silicide or a sulfur component from the surface of the substrate by supplying an aqueous solution containing ammonia to the substrate; and after the residue removing process, a drying process of drying the surface of the substrate that is wet with a rinsing liquid.

9. The substrate processing method of claim 8, further comprising: between the mask removing process and the residue removing process, another residue removing process of removing a residue including the sulfur component by supplying heated pure water to the substrate.

10. The substrate processing method of claim 8, wherein, in the drying process, on the surface of the substrate that is wet with the rinsing liquid, the rinsing liquid is replaced with a water-soluble alcohol, and then the surface of the substrate is dried.

11. The substrate processing method of claim 8, wherein, in the drying process, the surface of the substrate is dried using a processing fluid in a supercritical state.

12. The substrate processing method of claim 8, wherein the drying process includes:
    a first replacing process of replacing the rinsing liquid on the surface of the substrate that is wet with the rinsing liquid with an organic solvent;
    a water-repellent process of supplying a water-repellent agent to the surface of the substrate after the first replacing process;
    a second replacing process of replacing the water-repellent agent on the surface of the substrate with an organic solvent after the water-repellent process; and
    a shake-off process of shaking off the organic solvent located on the surface of the substrate after the second replacing process.

13. The substrate processing method of claim 8, wherein, in the mask removing process, the mask removing liquid is heated by reaction heat generated when the sulfuric acid and the pure water are mixed.

14. The substrate processing method of claim 8, wherein, in the mask removing process, the mask removing liquid is heated by reaction heat generated when the sulfuric acid and steam are mixed.

* * * * *